(12) United States Patent
Sugino et al.

(10) Patent No.: US 11,121,646 B2
(45) Date of Patent: Sep. 14, 2021

(54) ACTUATOR ELEMENT USING CARBON ELECTRODE

(71) Applicant: NATIONAL INSTITUTE OF ADVANCED INDUSTRIAL SCIENCE & TECHNOLOGY, Tokyo (JP)

(72) Inventors: Takushi Sugino, Ikeda (JP); Kinji Asaka, Ikeda (JP); Isao Takahashi, Tokyo (JP); Tomomasa Takatsuka, Tokyo (JP); Kenichi Mitsumori, Tokyo (JP); Nobuaki Haga, Tokyo (JP)

(73) Assignee: NATIONAL INSTITUTE OF ADVANCED INDUSTRIAL SCIENCE & TECHNOLOGY, Tokyo (JP)

( * ) Notice: Subject to any disclaimer, the term of this patent is extended or adjusted under 35 U.S.C. 154(b) by 0 days.

(21) Appl. No.: 16/439,966

(22) Filed: Jun. 13, 2019

(65) Prior Publication Data

US 2019/0356242 A1   Nov. 21, 2019

Related U.S. Application Data

(63) Continuation of application No. 14/389,140, filed as application No. PCT/JP2013/059278 on Mar. 28, 2013, now Pat. No. 10,367,429.

(30) Foreign Application Priority Data

Mar. 30, 2012   (JP) ................................ 2012-079763

(51) Int. Cl.
*H04N 1/00* (2006.01)
*F03G 7/00* (2006.01)
(Continued)

(52) U.S. Cl.
CPC ............ *H02N 1/002* (2013.01); *B32B 9/045* (2013.01); *B32B 27/08* (2013.01); *B32B 27/20* (2013.01);
(Continued)

(58) Field of Classification Search
None
See application file for complete search history.

(56) References Cited

U.S. PATENT DOCUMENTS

2003/0127967 A1   7/2003   Tsutsui et al.
2006/0098389 A1   5/2006   Liu et al.
(Continued)

FOREIGN PATENT DOCUMENTS

JP   2004-311733 A   11/2004
JP   2005-176428 A   6/2005
(Continued)

OTHER PUBLICATIONS

International Search Report dated Jul. 2, 2013, issued in counterpart International Application No. PCT/JP2013/059278 (in English; 2 pages).
(Continued)

*Primary Examiner* — Katie L. Hammer
(74) *Attorney, Agent, or Firm* — Westerman, Hattori, Daniels & Adrian, LLP

(57) ABSTRACT

An object of this invention is to create an actuator in which the amount of deformation is maintained and no displacement in the reverse direction occurs, even when a constant voltage is continuously applied for a long period of time. As a means for achieving the above object, the invention provides a conductive thin film comprising a polymer gel containing at least one organic molecule selected from the group consisting of electron-donating organic molecules and
(Continued)

electron-withdrawing organic molecules, a nano-carbon material, an ionic liquid, and a polymer.

15 Claims, 9 Drawing Sheets

(51) Int. Cl.

| | |
|---|---|
| *B81B 3/00* | (2006.01) |
| *B32B 27/08* | (2006.01) |
| *B32B 27/20* | (2006.01) |
| *C08K 3/04* | (2006.01) |
| *B32B 9/04* | (2006.01) |
| *H01B 1/24* | (2006.01) |
| *C08K 5/315* | (2006.01) |
| *C08K 5/3445* | (2006.01) |
| *H02N 1/00* | (2006.01) |

(52) U.S. Cl.
CPC ............ *B81B 3/0021* (2013.01); *C08K 3/041* (2017.05); *F03G 7/005* (2013.01); *H01B 1/24* (2013.01); *B32B 2262/106* (2013.01); *B32B 2307/202* (2013.01); *B32B 2457/00* (2013.01); *B81B 2201/032* (2013.01); *C08K 3/044* (2017.05); *C08K 3/046* (2017.05); *C08K 5/315* (2013.01); *C08K 5/3445* (2013.01); *C08K 2201/011* (2013.01)

(56) References Cited

U.S. PATENT DOCUMENTS

| | | | |
|---|---|---|---|
| 2006/0257645 A1 | 11/2006 | Asaka et al. | |
| 2006/0266981 A1 | 11/2006 | Asaka et al. | |
| 2008/0261135 A1* | 10/2008 | Yamada | G03G 5/14704 430/58.1 |
| 2010/0133520 A1 | 6/2010 | Bressers et al. | |
| 2011/0074253 A1 | 3/2011 | Hino et al. | |
| 2011/0287316 A1 | 11/2011 | Lu et al. | |
| 2013/0260207 A1* | 10/2013 | Uemura | H01M 4/604 429/144 |

FOREIGN PATENT DOCUMENTS

| | | |
|---|---|---|
| JP | 2005-323482 A | 11/2005 |
| JP | 2011-078262 A | 4/2011 |
| JP | 2011-201933 A | 10/2011 |
| JP | 2011-205861 A | 10/2011 |
| JP | 2012-055147 A | 3/2012 |
| WO | 2009/157491 A1 | 12/2009 |

OTHER PUBLICATIONS

Notification of Reasons for Refusal, dated Apr. 3, 2018, issued in counterpart Japanese patent application No. 2017-204917 (w/ English machine translation; 6 pages).

\* cited by examiner 2 1 2

3 2 1 2 3

ACTUATOR ELEMENT USING CARBON ELECTRODE

CROSS-REFERENCE TO RELATED APPLICATIONS

The present application is a continuation of U.S. Ser. No. 14/389,140 filed on Sep. 29, 2014, which is a U.S. national stage of International Application No. PCT/JP2013/059278 filed on Mar. 28, 2013, each of which claims priority to the specification of Japan Patent Application No. 2012-79763 filed on Mar. 30, 2012, the entire content of each of the foregoing is herein incorporated by reference.

TECHNICAL FIELD

The present invention relates to a conductive thin film, a laminate comprising the conductive thin film, and an actuator element comprising the conductive thin film. The actuator element herein refers to an actuator element that is driven by an electrochemical process such as an electrochemical reaction or the charging and discharging of an electrical double layer.

BACKGROUND ART

An actuator that uses a gel containing carbon nanotubes and an ionic liquid as a conductive active layer with elastic has been proposed as an actuator element that can operate in air or a vacuum (Patent Literature 1).

Hitherto known actuator elements undergo bending deformation when a voltage is applied; however, it has become clear that there is a problem in that the amount of deformation decreases or the actuator elements are deformed in the reverse direction when a constant voltage is continuously applied for a long period of time.

Patent Literature 2 discloses enhancing conductivity by doping carbon nanotubes with an organic molecule, but does not disclose inhibiting deformation in the reverse direction (return displacement).

CITATION LIST

Patent Literature

PTL 1: JP2005-176428A
PTL 2: JP2011-078262A

SUMMARY OF INVENTION

Technical Problem

An object of the present invention is to create an actuator in which the amount of deformation is maintained and no displacement in the reverse direction occurs, even when a constant voltage is continuously applied for a long period of time.

Solution to Problem

The responsiveness of actuators is greatly affected by the electrochemical properties of electrodes.

The present inventors investigated change in actuator responsiveness by adding an organic molecule with acceptor properties (electron-withdrawing organic molecule), which induces p-type semiconductor properties, an organic molecule with donor properties (electron-donating organic molecule), which induces n-type semiconductor properties, or both molecules to a nano-carbon material in an electrode.

The results reveal that high-speed responsiveness is improved when an electron-donating organic molecule is added, whereas responsiveness in the low-frequency region is improved when an electron-withdrawing organic molecule is added. Regarding the return phenomenon of displacement when a constant voltage is continuously applied, the results reveal that when an electron-withdrawing organic molecule is added, the actuator is free of reverse displacement for a period of time as long as 2 hours or more, although a little return is initially observed.

Patent Literature 2 discloses impregnating an electrode film (conductive thin film) with a treatment liquid containing an organic molecule having doping action on carbon nanotubes. Although this improves conductivity, Reference 2 does not mention whether return displacement can be inhibited.

The present invention has been accomplished based on these findings. The present invention provides a conductive thin film, a laminate, and an actuator element as follows.

Item 1. A conductive thin film comprising a polymer gel containing at least one organic molecule selected from the group consisting of electron-donating organic molecules and electron-withdrawing organic molecules, a nano-carbon material, an ionic liquid, and a polymer.

Item 2. The conductive thin film according to Item 1, wherein the nano-carbon material is selected from the group consisting of carbon nanotubes, carbon nanohorns, and carbon nanofibers.

Item 3. The conductive thin film according to Item 1 or 2, wherein the organic molecule is present in an amount of 3 to 80 parts by weight per 100 parts by weight of the total amount of the nano-carbon material, the ionic liquid, and the polymer.

Item 4. The conductive thin film according to Item 3, wherein the organic molecule is present in an amount of 15 to 40 parts by weight per 100 parts by weight of the total amount of the nano-carbon material, the ionic liquid, and the polymer.

Item 5. The conductive thin film according to any one of Items 1 to 4, which comprises both an electron-donating organic molecule and an electron-withdrawing organic molecule as the organic molecule.

Item 6. The conductive thin film according to any one of Items 1 to 5, which comprises tetracyanoquinodimethane (TCNQ) as the organic molecule.

Item 7. The conductive thin film according to Item 6, wherein tetracyanoquinodimethane is present in an amount of 20 to 100 parts by weight per 50 parts by weight of the nano-carbon material.

Item 8. The conductive thin film according to any one of Items 1 to 7, which further comprises a conductive additive.

Item 9. A laminate comprising one or more of the conductive thin films according to any one of Items 1 to 8 and one or more electrolyte membranes comprising an ionic liquid and a polymer.

Item 10. An actuator element comprising the laminate according to Item 9.

Item 11. The actuator element according to Item 10, wherein at least two conductive thin film layers each comprising the conductive thin film according to Item 1 are formed as electrodes so as to be insulated from each other on the surfaces of an electrolyte membrane comprising an ionic liquid and a polymer, and the actuator element can be deformed by application of a potential difference between the conductive thin film layers.

Advantageous Effects of Invention

With the present invention, high-speed responsiveness or responsiveness in the low-frequency region can be further improved, and the return phenomenon of displacement when continuously applying a constant voltage can be suppressed.

The present invention is a highly important discovery in putting to practical use of a polymer actuator using a nanocarbon-dispersed electrode.

BRIEF DESCRIPTION OF DRAWINGS

FIG. 1 (B) is a schematic view of the structure of an example of the actuator element of the present invention (five-layer structure).

FIG. 3(A) shows a semi-log graph, and FIG. 3(B) shows a log-log graph.

FIG. 3(C) shows a semi-log graph, and FIG. 3(D) shows a log-log graph.

FIG. 3(E) shows a semi-log graph, and FIG. 3(F) shows a log-log graph.

FIG. 5(A) shows a semi-log graph, and FIG. 5(B) shows a log-log graph.

FIG. 5(C) shows a semi-log graph, and FIG. 5(D) shows a log-log graph.

FIG. 5(E) shows a semi-log graph, and FIG. 5(F) shows a log-log graph.

Figure 1A:
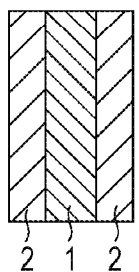
FIG. 1 (A) is a schematic view of the structure of an example of the actuator element of the present invention (three-layer structure).

In the present specification, "durability upon application of a direct-current voltage" or "durability" refers to how small the reduction in the deformation amount or the deformation in the reverse direction is when a constant voltage is continuously applied to an actuator element for a long period of time.

DESCRIPTION OF EMBODIMENTS

The conductive thin film provided by the present invention is used as an electrode layer of an actuator element. One or more of the conductive thin films of the present invention and one or more electrolyte membranes can be stacked to form an actuator element comprising one or more conductive thin film layers and the one or more electrolyte membranes (ion conductive layers).

In the present invention, a nano-carbon material, a polymer, an ionic liquid, and at least one organic molecule selected from the group consisting of electron-donating organic molecules and electron-withdrawing organic molecules are used in the conductive thin film used as an electrode layer of an actuator element.

In the present specification, "at least one organic molecule selected from the group consisting of electron-donating organic molecules and electron-withdrawing organic molecules" may be simply referred to as "organic molecule."

The ionic liquid used in the present invention is also called "room-temperature molten salt" or simply "molten salt," and it is in a molten state within a wide range of temperatures, including ordinary temperature (room temperature). The ionic liquid is a salt that is in a molten state, for example, at 0° C., preferably at −20° C., and more preferably at −40° C. The ionic liquid used in the present invention preferably has high ion conductivity.

Although various known ionic liquids are usable in the present invention, those that are in a liquid state and stable at or around ordinary temperature (room temperature) are preferred. Examples of preferable ionic liquids usable in the present invention are those containing cations (preferably imidazolium ion or quaternary ammonium ion) represented by formulae (I) to (IV) below and anions ($X^-$).

(I)

(II)

 (III)

 (IV)

In formulae (I) to (IV) above, R represents a straight or branched $C_1$-$C_{12}$ alkyl group or a straight or branched alkyl group that contains one or more ether linkage and in which the total number of carbon and oxygen atoms is 3 to 12. In formula (I), $R^1$ represents a straight or branched $C_1$-$C_4$ alkyl group or a hydrogen atom. In formula (I), R and $R^1$ are preferably not the same. In formulae (III) and (IV), each x is an integer of 1 to 4.

Examples of straight or branched $C_1$-$C_{12}$ alkyl groups include methyl, ethyl, n-propyl, isopropyl, n-butyl, isobutyl, sec-butyl, t-butyl, pentyl, hexyl, heptyl, octyl, nonyl, decyl, undecyl, dodecyl, and the like. The number of carbon atoms is preferably 1 to 8 and more preferably 1 to 6.

Examples of straight or branched $C_1$-$C_4$ alkyl groups include methyl, ethyl, n-propyl, isopropyl, n-butyl, isobutyl, sec-butyl, and t-butyl.

Examples of straight or branched alkyl groups that contain one or more ether linkage and in which the total number of carbon and oxygen atoms is 3 to 12 include $CH_2OCH_3$ and $(CH_2)_p(OCH_2CH_2)_qOR^2$ (wherein p is an integer of 1 to 4, q is an integer of 1 to 4, and $R^2$ represents $CH_3$ or $C_2H_5$).

Examples of anions ($X^-$) include tetrafluoroboric acid ion ($BF_4^-$), $BF_3CF_3^-$, $BF_3C_2F_5^-$, $BF_3C_3F_7$, $BF_3C_4F^-$, hexafluorophosphoric acid ion ($PF_6^-$), bis(trifluoromethanesulfonyl) imidic acid ion (($CF_3SO_2)_2N^-$), perchloric acid ion ($ClO_4^-$), tris (trifluoromethanesulfonyl) carbon acid ion (($CF_3SO_2)_3C^-$), trifluoromethanesulfonic acid ion ($CF_3SO_3$), dicyanamide ion (($CN)_2N^-$), trifluoroacetic acid ion ($CF_3COO^-$), organic carboxylic acid ion, and halogen ion.

Specific examples of ionic liquids are those wherein the cation is 1-ethyl-3-methylimidazolium ion or $[N(CH_3)(CH_3)(C_2H_5)(C_2H_4OC_2H_4OCH_3)]^+$, and the anion is halogen ion or tetrafluoroboric acid ion. It is also possible to further lower the melting point by using two or more cations and/or anions.

However, the ionic liquid is not limited to the above combinations, and any ionic liquid having an ionic conductivity of 0.01 $Sm^{-1}$ or higher may be used.

The nano-carbon material used in the present invention encompasses carbon nanotubes, carbon nanohorns, and carbon nanofibers. These may be used singly or in a combination of two or more. In addition to the nano-carbon material, a conductive additive may be added to the conductive thin film of the present invention. Examples of conductive additives include conductive polymers, such as carbon black, polyaniline, polythiophene, and polypyrrole. These conductive additives may be used singly or in a combination of two or more. The nano-carbon material means a nano-sized carbon-containing conductive material. Any carbon nanotubes, carbon nanohorns, or carbon nanofibers may be used as long as the average minor axis is nanosize (for example, average minor axis of 500 nm or less, or 300 nm or less, and in particular, 100 nm or less). The major axis is not particularly limited and may range from the submicron level to several millimeters or longer, on average. The carbon nanotubes may be single-walled carbon nanotubes or multi-walled carbon nanotubes. The conductive additive is preferably nanosize. Fine particles of the nanosized conductive additive (hereafter, may be referred to as conductive fine particles), such as carbon black, polyaniline, polythiophene, or polypyrrole, having a mean particle size of less than 1 m, for example, 500 nm or less, or 300 nm or less, in particular, 100 nm or less, may be preferably used. When the conductive fine particles are used as nanoparticles, the mean particle size of the conductive fine particles must be nanosize. However, when the conductive fine particles are combined with another carbon-containing conductive nanomaterial, submicron-sized or micron-sized conductive fine particles may be used.

Preferable examples of carbon nanotubes that are put to practical use include, but are not limited to, HiPco (produced by Unidym), which uses carbon monoxide as a raw material and can be produced in a relatively large scale.

Examples of polymers usable in the present invention include copolymers of fluorinated olefin having one or more hydrogen atoms and perfluorinated olefin, such as polyvinylidene fluoride-hexafluoropropylene copolymer [PVDF (HFP)]; homopolymers of fluorinated olefin having one or more hydrogen atoms, such as polyvinylidene fluoride (PVDF); perfluorosulfonic acid (Nafion); poly(meth)acrylates, such as poly-2-hydroxyethyl methacrylate (poly-HEMA), and polymethyl methacrylate (PMMA); polyethylene oxide (PEO); polyacrylonitrile (PAN); and the like.

Examples of organic molecules include electron-donating organic molecules and electron-withdrawing organic molecules. The conductive thin film may comprise one or more electron-donating organic molecules or one or more electron-withdrawing organic molecules. The conductive thin film may comprise at least one electron-donating organic molecule and at least one electron-withdrawing organic molecule in combination.

Examples of electron-withdrawing organic molecules include BQ:p-benzoquinone, $R^1$ $R^2$ $R^3$ $R^4$ BQ ($R^1$ to $R^4$ are the same or different and each represents H, Me (methyl), Cl, Br, I, F, or CN (cyano)), $R^1$BQ:2-$R^1$-BQ ($R^1$ represents Me, Cl, or Br), MeBQ, ClBQ, BrBQ, $R^1$ $R^2$ BQ:2-$R^1$-5-$R^2$-BQ ($R^1$ and $R^2$ are the same or different and each represents Me, Cl, or Br), $Me_2$ BQ, $Cl_2$ BQ, ClMeBQ, $Br_2$ BQ, BrMeBQ, 2-$R^1$-6-$R^2$-BQ ($R^1$ and $R^2$ are the same or different and each represents Me, Cl, or Br), 2,6-$Cl_2$ BQ, 2,6-$Br_2$ BQ, 2,6-$Me_2$ BQ, $Cl_3$ BQ:2,3,5-trichloro-p-benzoquinone, CA (chloranil), BA (bromanil), IA (iodanil), FA (fluoranil), DDQ:2,3-dicyano-5,6-dichloro-p-benzoquinone, $Me_4$ BQ (tetramethyl-p-benzoquinone), o-BQ (o-benzoquinone), o-CA (o-chloranil), o-BA (o-bromanil), NQ (naphthoquinone), $R^1$ $R^2$ $R^3R^4$ $R^5$ $R^6$ NQ, $R^1$ $R^2$ NQ (for example, 2-$R^1$-3-$R^2$-NQ (R and $R^2$ are the same or different and each represents Cl or CN)), $Cl_2$ NQ (2,3-dichloronaphthoquinone), $(CN)_2$ NQ (2,3-dicyanonaphthoquinone), AQ (9,10-anthraquinone), $R^1$ $R^2$ $R^3$ $R^4$ $R^5$ AQ, TCNQ (tetracyanoquinodimethane), $R^1$ $R^2$ $R^3$ $R^4$TCNQ, $R^1$TCNQ (for example, 2-$R^1$-TCNQ ($R^1$ represents Me, OMe (methoxy), F, Cl, or Br)), MeTCNQ, (OMe) TCNQ, FTCNQ, ClTCNQ, BrTCNQ, $R^1$ $R^2$TCNQ (for example, 2-$R^1$-5-$R^2$-TCNQ ($R^1$ and $R^2$ are the same or different and each represents Me, Et (ethyl), Pr (propyl), OMe, F, Cl, Br, or I)), $Me_2$TCNQ, $Et_2$TCNQ, $Pr_2$TCNQ, $(OMe)_2$TCNQ, $F_2$TCNQ, $Cl_2$TCNQ, $Br_2$TCNQ, $I_2$TCNQ, ClMeTCNQ, BrMeTCNQ, IMeTCNQ, $F_4$TCNQ, TCNNQ (tetracyano-1,4-naphthoquinodimethane), $R^1$ $R^2$ $R^3$ $R^4$ $R^5$ $R^6$ TCNNQ ($R^1$ to $R^6$ are the same or different and each represents H, Me, Cl, Br, I, F, or CN), TCNAQ (tetracyano-9,10-anthraquinodimethane), $R^1$ $R^2$ $R^3$ $R^4$ $R^5$ TCNAQ ($R^1$ to $R^5$ are the same or different and each represents H, Me, Cl, Br, I, F, or CN), TNAP (tetracyano-2,6-naphthoquinodimethane), DCNQI (dicyanoquinonediimine), $R^1$ DCNQI(2-$R^1$-dicyanoquinonediimine ($R^1$ represents Me, Cl, or Br)), MeDCNQI (2-methyldicyanoquinonediimine), ClDCNQI (2-chlorodicyanoquinonediimine), BrDCNQI(2-bromodicyanoquinonediimine), $R^1 R^2$ DCNQI (2-$R^1$-5-$R^2$-DCNQI ($R^1$ and $R^2$ are the same or different and each represents Me, Cl, or Br)), DMeDCNQI (2,5-dimethyldicyanoquinonediimine), ClMeDCNQI (2-methyl-5-dimethyldicyanoquinonediimine), DClDCNQI (2,5-dichlorodicyanoquinonediimine), BrMeDCNQI (2-bromo-5-dimethyldicyanoquinonediimine), $Br_2$ DCNQI (2,5-dibromodicyanoquinonediimine), $Cl_4$ DCNQI (2,3,5,6-tetrachlorodicyanoquinonediimine), $F_4$ DCNQI (2,3,5,6-tetrafluorodicyanoquinonediimine), DCNNQI (dicyano-1,4-naphthoquinonediimine), $R^1 R^2 R^3 R^4 R^5 R^6$ DCNNQI ($R^1$ to $R^6$ are the same or different and each represents H, Me, Cl, Br, I, F, or CN), DCNAQI (dicyano-9,10-anthraquinonediimine), $R^1 R^2 R^3 R^4 R^5$ DCNAQI ($R^1$ to $R^5$ are the same or different and each represents H, Me, Cl, Br, I, F, or CN), TNB (1,3,5-trinitrobenzene), TNF (2,4,7-trinitro-9-fluorenone), DTF (2,4,7-trinitro-9-fluorenylidenemalononitrile), TENF (2,4,5,7-tetranitro-9-fluorenone), DTENF (2,4,5,7-tetranitro-9-fluorenylidenemalononitrile), TCNE (tetracyanoethylene), HCBD (hexacyanobutadiene), HCNB (hexacyanobenzene), TCNB (tetracyanobenzene), DCNB (dicyanobenzene), PMDA (pyromellitic dianhydride), and the like.

Examples of electron-donating organic molecules include aniline, N-methylaniline, N,N-dimethylaniline, PD (p-phenylenediamine), ClPD (2-chloro-p-phenylenediamine), ClMePD (2-chloro-5-methyl-p-phenylenediamine), DClPD (2,5-dichloro-p-phenylenediamine), DMePD (2,5-dimethyl-p-phenylenediamine), DAD (diaminodurene), TMPD (N,N,N',N'-tetramethyl-PD), N,N-DMePD (N,N-dimethyl-PD, 1,5-dimethylnaphthalene), 1,8-dimethylnaphthalene, benzidine, TMB (3,3',5,5'-tetramethylbenzidine), NNN'N'-TMB (N,N,N',N'-tetramethyl-benzidine), DAP (1,6-diaminopyrene), TMDAP (N,N,N',N'-tetramethyl-DAP), phenazine, $M_2$ P (5,10-dimethyl-5,10-dihydrophenazine), $E_2$ P (5,10-diethyl-5,10-dihydrophenazine), $Pr_2$ P (5,10-dipropyl-5,10-dihydrophenazine), HMP (5-methyl-5,10-dihydrophenazine), $M_6$ P (5,10-dihydro-2,3,5,7,8,10-hexamethylphenazine), PTZ (phenothiazine), N-MePTZ (N-methylphenothiazine), ClPTZ (2-chlorophenothiazine), TDAE (tetrakis(dimethylamino)ethylene ferrocene), dimethylferrocene, decamethylferrocene, nickelocene, decamethylnickelocene, cobaltocene, TTF (tetrathiafulvalene), DMTTF (2,6-dimethyltetrathiafulvalene), TMTTF (tetramethyltetrathiafulvalene), DPhTTF (2,6-diphenyltetrathiafulvalene), DPhDMTTF (2,6-diphenyl-3,7-dimethyltetrathiafulvalene), DBTTF (dibenzotetrathiafulvalene), OMTTF (octamethylenetetrathiafulvalene), HMTTF (hexamethylenetetrathiafulvalene), TSF (tetraselenafulvalene), TMTSF (tetramethyltetraselenafulvalene), HMTSF (hexamethylenetetraselenafulvalene), HMTTeF (hexamethylenetetratellurafulvalene), TTT (tetrathiatetracene), TST (tetraselenatetracene), BTP (tetraphenylbithiopyralidene), naphthalene, anthracene, phenanthrene, pentacene, pyrene, penylene, azulene, acenaphthene, carbazole, acridine, and the like.

From the viewpoint that a conductive thin film in which the constituent components are homogeneously mixed can be easily prepared, it is preferred to use an organic molecule with high dispersibility in the solvent described below. For example, $F_4TCNQ$ (tetrafluorotetracyanoquinodimethane) tends to have poor dispersibility in a solvent.

The conductive thin film used for an electrode layer of an actuator element comprises a nano-carbon material, an ionic liquid, a polymer, and at least one organic molecule selected from the group consisting of electron-donating organic molecules and electron-withdrawing organic molecules.

The preferable proportions of these components in the conductive thin film are as follows:
Nano-Carbon Material:
5 to 90% by weight, preferably 10 to 70% by weight, and more preferably 15 to 50% by weight;
Ionic Liquid:
5 to 80% by weight, preferably 15 to 73.4% by weight, more preferably 20 to 69% by weight; and
Polymer:
4 to 70% by weight, preferably 10 to 68.4% by weight, more preferably 11 to 64% by weight.

The organic molecule is present in an amount of 3 to 80 parts by weight, preferably 10 to 65 parts by weight, and more preferably 15 to 40 parts by weight, per 100 parts by weight of the total amount of the nano-carbon material, the ionic liquid, and the polymer.

The mixing ratio of the nano-carbon material and the organic molecule is not particularly limited. In a preferable embodiment of the present invention, the organic molecule is present in an amount of 20 to 100 parts by weight, preferably 30 to 80 parts by weight, and particularly preferably 40 to 60 parts by weight, per 50 parts by weight of the nano-carbon material. If an excess amount of the organic molecule is used relative to the nano-carbon material, the responsiveness tends to decrease. If the amount of the organic molecule is insufficient, for example, the effect of maintaining the amount of deformation even when a constant voltage is continuously applied for a long period of time tends to be unsatisfactory.

When two or more organic molecules are used, the ratio of the organic molecules is not particularly limited. When two organic molecules are used, the ratio of the organic molecules may be, for example, 1:3 to 3:1, 1:2 to 2:1, or 1.5:0.95 to 0.95:1.5. The organic molecules may be used in equal amounts.

Figure 1B:
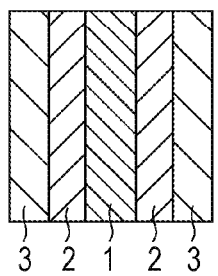

The actuator element of the present invention is an actuator element comprising one or more conductive thin film layers and one or more electrolyte membranes (ion conductive layers), the actuator element being formed by stacking one or more of the conductive thin films described above and the one or more electrolyte membranes. The conductive thin film layers are preferably formed so as to be insulated from each other. The actuator element of the present invention has, for example, a three-layer structure in which electrolyte membrane 1 is sandwiched on both sides thereof by conductive thin film layers (electrode layers) 2,2 (FIG. 1(A)). Each conductive thin film layer comprises a nano-carbon material, an ionic liquid, a polymer, and a conductive additive. To increase the surface conductivity of the electrodes, the actuator element of the present invention may also have a five-layer structure in which conductive layers 3,3 are further formed on the respective outside surfaces of the electrode layers 2,2 (FIG. 1(B)).

In a preferable embodiment of the present invention, one or more conductive thin film layers are formed on the surface(s) of an electrolyte membrane. To obtain an actuator element by forming one or more conductive thin film layers on the surface(s) of an electrolyte membrane, it is possible to alternately apply by casting, dry, and stack a gel solution for electrodes and a gel solution for electrolyte membranes. The gel solution for electrodes is a solution in which a nano-carbon material, an ionic liquid, a polymer, and at least one organic molecule are dispersed in a solvent. The gel solution for electrolyte membranes contains an ionic liquid and a polymer. Alternatively, one or more conductive thin films separately obtained by casting and drying may be thermally compressed on the surface(s) of an electrolyte membrane obtained by casting and drying as described above.

The conductive thin film can be also obtained, for example, as follows. The conductive thin film can be obtained by permeating a nano-carbon material containing at least one organic molecule with an ionic liquid. Alternatively, the conductive thin film can also be obtained by using an ionic liquid gel solution prepared by dispersing an ionic liquid and a polymer in a solvent, and permeating a nano-carbon material containing at least one organic molecule with the solution. Alternatively, the conductive thin film can be obtained by dipping a nano-carbon material containing at least one organic molecule in the solution and then drying the solvent.

The electrolyte membrane can be obtained by forming a film from the gel solution for electrolyte membranes (ion gel solution) by casting and then evaporating the solvent, followed by drying.

In the present invention, it is important to homogeneously mix the components in the preparation of a conductive thin film layer comprising at least one organic molecule, a nano-carbon material and an ionic liquid, and, if necessary, a polymer. To prepare a dispersion liquid in which the components are homogeneously mixed, it is preferable to use a solvent (medium). Specific examples of solvents include hydrophobic solvents, hydrophilic solvents, and combinations of hydrophobic solvents and hydrophilic solvents.

The solvent to be used can be suitably selected. For example, when an ionic liquid, at least one organic molecule, a polymer, etc., are hydrophilic, a mixed solvent of a hydrophilic solvent and a hydrophobic solvent, or a hydrophilic solvent can be used. When an ionic liquid, at least one organic molecule, a polymer, etc., are hydrophobic, a hydrophobic solvent can be used. The use of a mixed solvent of a hydrophilic solvent and a hydrophobic solvent may enhance the performance of the conductive thin film layer compared to the case in which a hydrophilic solvent is used, and thus is a preferable embodiment.

Examples of hydrophilic solvents include carbonates such as ethylene carbonate, propylene carbonate, dimethyl carbonate, diethyl carbonate, methylethyl carbonate, propylene carbonate, and butylene carbonate; ethers such as tetrahydrofuran; acetone; lower alcohols having 1 to 3 carbon atoms, such as methanol and ethanol; acetonitrile; N,N-dimethylacetamide; N-methyl-2-pyrrolidone; dimethylformamide; and the like. Examples of hydrophobic solvents include ketones having 5 to 10 carbon atoms, such as 4-methylpentan-2-one; halogenated hydrocarbons such as chloroform and methylene chloride; aromatic hydrocarbons such as toluene, benzene, and xylene; aliphatic or alicyclic hydrocarbons such as hexane and cyclohexane; and the like.

A dispersion liquid for producing the conductive thin film of the present invention may be prepared by kneading at least one organic molecule, an ionic liquid, and a nano-carbon material to form a gel and then adding a polymer and a solvent (medium) to the gel. Alternatively, the dispersion liquid may be prepared without forming a gel by adding at least one organic molecule, a nano-carbon material, an ionic liquid, and a polymer and, if necessary, a solvent (medium). In this case, dispersion by ultrasonic waves is also effective in mixing the components.

When the dispersion liquid is prepared through the formation of a gel, the ratio of the mixed solvent, i.e., the ratio of the hydrophilic solvent to the hydrophobic solvent (weight ratio), is preferably 20:1 to 1:10 and more preferably 2:1 to 1:5.

When the dispersion liquid is prepared without forming a gel, the ratio of the hydrophilic solvent (PC) to the hydrophobic solvent (MP) is preferably 1/100 to 20/100, and more preferably 3/100 to 15/100. Also, N,N-dimethylacetamide or N-methyl-2-pyrrolidone may be used as a single solvent.

The conductive thin film comprises a polymer gel containing at least one organic molecule, a nano-carbon material, an ionic liquid, and a polymer.

The mixing ratio (weight ratio) of the organic molecule, the nano-carbon material, and the ionic liquid to the polymer in the conductive thin film is preferably (organic molecule+nano-carbon material+ionic liquid):(polymer)=1:2 to 5:1, and more preferably (organic molecule+nano-carbon material+ionic liquid):(polymer)=1:1 to 3:1. A dispersion liquid for preparing the conductive thin film can also be obtained by mixing the organic molecule, the nano-carbon material, and the ionic liquid to form a gel in advance and mixing the polymer and the solvent with the gel. In this case, the ratio of the organic molecule, the nano-carbon material, and the ionic liquid to the polymer is preferably 1:1 to 3:1.

Although the conductive thin film may contain a small amount of solvent (e.g., hydrophobic solvent and/or hydrophilic solvent), it is preferred that a solvent that can be removed in normal dry conditions be removed as much as possible.

The electrolyte membrane is formed from a gel composition comprising a polymer and an ionic liquid. In the present specification, the "electrolyte membrane" can also be referred to as an "ion conductive layer." In a preferred electrolyte membrane, the mixing ratio (weight ratio) of the ionic liquid to the polymer in obtaining the gel composition is preferably ionic liquid:polymer=1:4 to 4:1 and more preferably ionic liquid:polymer=1:2 to 2:1. In this case, it is preferable to use a hydrophilic solvent or a solvent in which a hydrophilic solvent and a hydrophobic solvent are mixed at any ratio.

The electrolyte layer serves as a separator that separates two or more conductive thin film layers. The electrolyte layer can be formed by dissolving a polymer in a solvent and performing a common method such as coating, printing, extrusion, casting, or injection. The electrolyte layer may be formed substantially from a polymer only, or an ionic liquid may be added to a polymer, thereby forming the electrolyte layer.

The polymer used for the conductive thin film layer and the polymer used for the electrolyte layer may be the same or different. However, it is preferred that the polymers be the same or have similar properties from the viewpoint of improving the adhesion between the conductive thin film layer and the ion conductive layer.

The thickness of the electrolyte membrane in the actuator element of the present invention is preferably 5 to 200 μm and more preferably 10 to 100 μm. The thickness of the conductive thin film layer is preferably 10 to 500 μm, and more preferably 50 to 300 μm. Spin coating, printing, spraying, etc., may be used for forming each layer. Extrusion, injection, etc., may also be used.

In the thus-obtained actuator element, deformation of about 0.05 to about 1 times the length of the element can be obtained within a few seconds when a direct-current voltage of 0.5 to 4 V is applied across the electrodes (the electrodes being connected to the conductive thin film layers). The actuator element can show the deformation in a flexible manner in air or a vacuum.

With the actuator element that can be obtained by using the method described above, the effective interface area between the nano-carbon material and the ionic liquid in the gel becomes extremely large, and the impedance in the interface electrical double layer becomes small. Accordingly, the electrically stimulated expansion/contraction effect of the nano-carbon materials can be effectively used. From a mechanical viewpoint, the adhesion in the connection of the interface is improved, and thus the durability of the element is increased. As a result, an element having excellent responsiveness, a large deformation, and sufficient durability in air or a vacuum can be obtained. Furthermore, the element has a simple structure and can easily be made smaller and operated at low power. Furthermore, by adding a conductive additive to the nano-carbon material, the conductivity and packing density of the electrode layer are improved resulting in effective generation of the mechanical force compared with hitherto known actuator elements of the same type.

Since the actuator element of the present invention operates with high durability in air or a vacuum and flexibly operates at low voltage, it is suitable as an actuator for use in robots that have contact with humans (for example, actuators for use in personal robots such as home robots, robotic pets, and amusement robots), for which safety is required; in robots that work in special conditions such as in outer-space environments, in vacuum chambers, and in rescuing; in surgical devices, muscle suits, robots for bed-sore prevention, and like medical and welfare robots; in brakes; in micromachines; and the like.

There is increasing demand for actuators to be used, for example, for transporting specimens and performing positioning, in particular, in fields where materials are produced in a vacuum environment or an ultra-clean environment to obtain products with high purity. The actuator element of the present invention, which uses an ionic liquid that does not evaporate, can be effectively used as a contamination-free actuator in a process performed in a vacuum environment.

It is necessary to form at least two conductive thin film layers on the surfaces of the electrolyte membrane, and it is possible to cause the actuator element to make complicated movement by disposing multiple conductive thin film layers 2 on the surfaces of flat electrolyte membrane 1. Such an actuator element makes it possible to achieve transportation by peristaltic movement, micromanipulators, etc. Also, the shape of the actuator element of the present invention is not limited to a flat shape, and the element can easily be produced in any shape. For example, the element may have four conductive thin film layers 2 formed around electrolyte membrane 1 in the form of a rod having a diameter of about 1 mm. By using this element, an actuator that can be inserted into a narrow tube can be obtained.

EXAMPLES

The present invention will be described in more detail based on Examples, but is obviously not limited to the Examples.

In the Examples, the displacement of each of the actuator elements was evaluated as follows.

Method for Evaluating Displacement of Actuator Element

Figure 2:
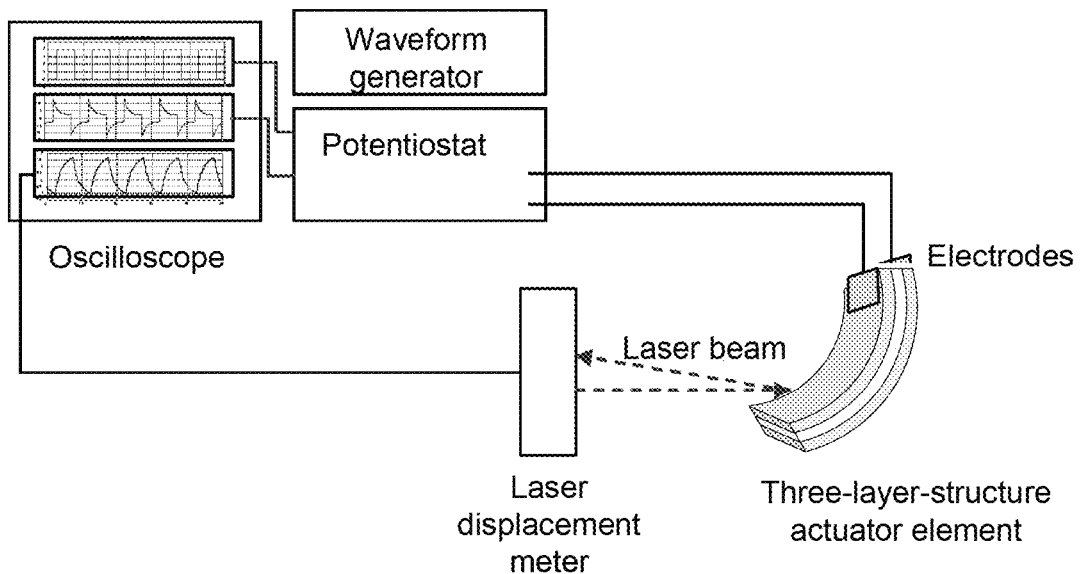
FIG. 2 shows an evaluation method with a laser displacement meter used for evaluating displacement of actuator elements in the Examples of the present invention.
Figure 3A:
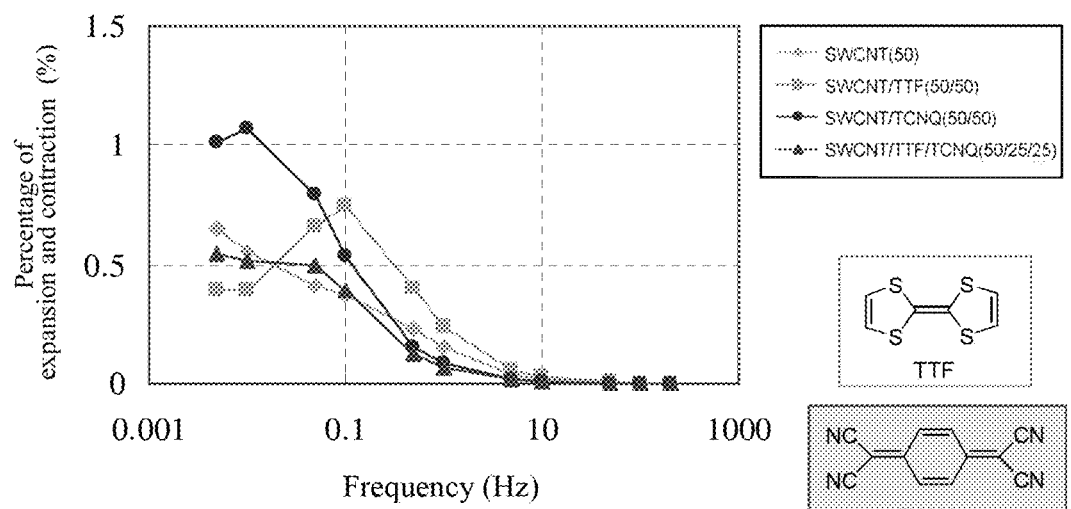
FIGS. 3(A) and 3(B) show frequency dependence of the displacement (percentage of expansion and contraction) of each of the actuators obtained in Examples 1 to 3 and Comparative Example 1. The horizontal axis indicates frequency (Hz), and the vertical axis indicates the percentage of expansion and contraction (%).
Figure 3B:
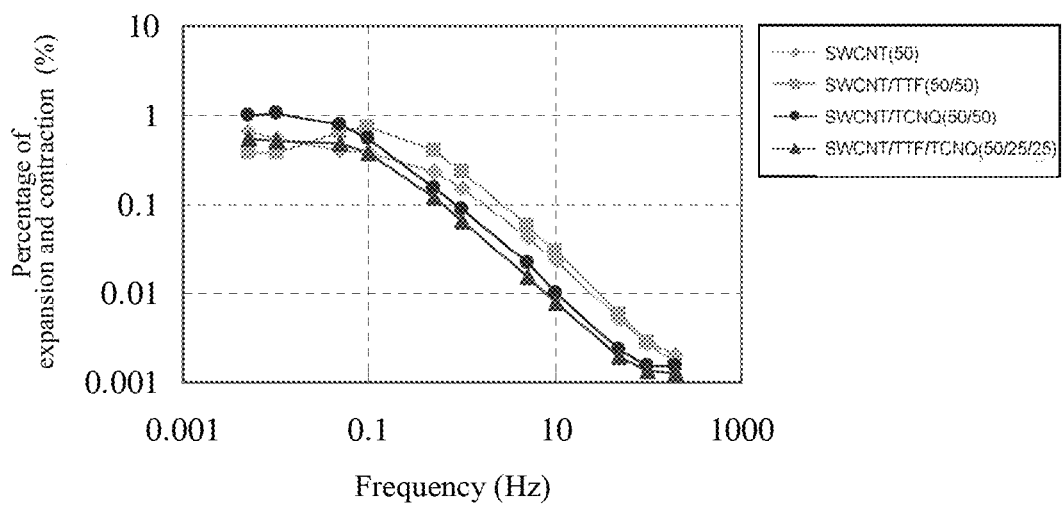
Figure 3C:
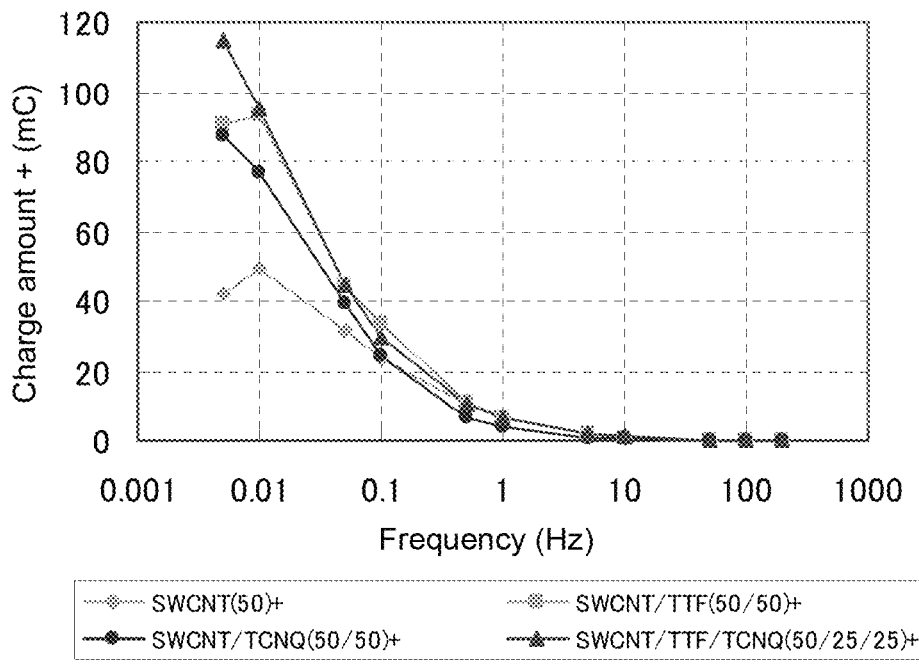
FIGS. 3(C) and 3(D) show frequency dependence of the charge (charge amount (positive)) of each of the actuators obtained in Examples 1 to 3 and Comparative Example 1. The horizontal axis indicates frequency (Hz), and the vertical axis indicate the charge amount (positive).
Figure 3D:
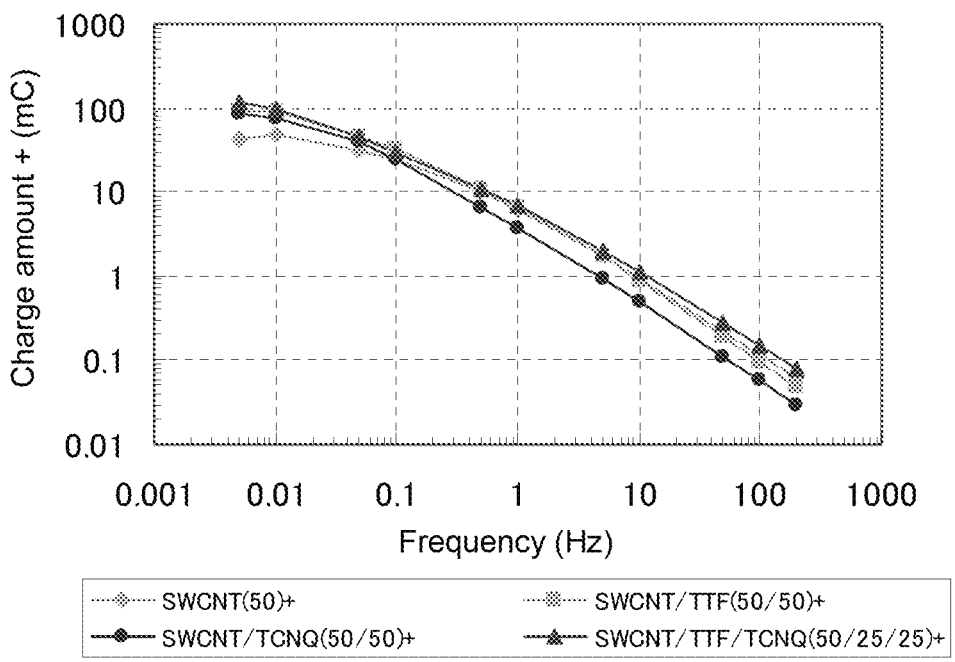
Figure 3E:
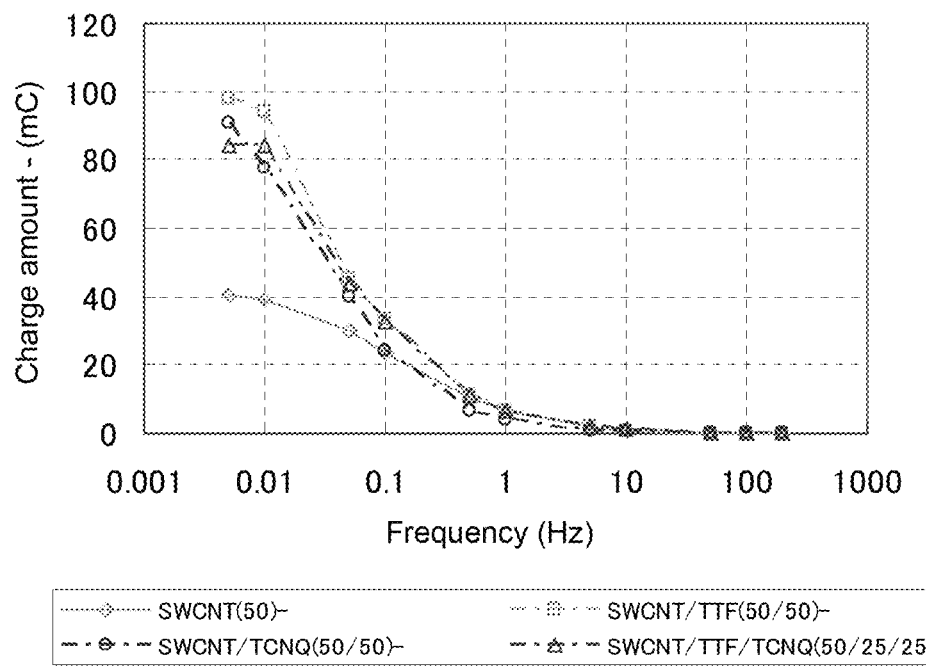
FIGS. 3(E) and 3(F) show frequency dependence of the charge (charge amount (negative)) of each of the actuators obtained in Examples 1 to 3 and Comparative Example 1. The horizontal axis indicates frequency (Hz), and the vertical axis indicates the charge amount (negative).
Figure 3F:
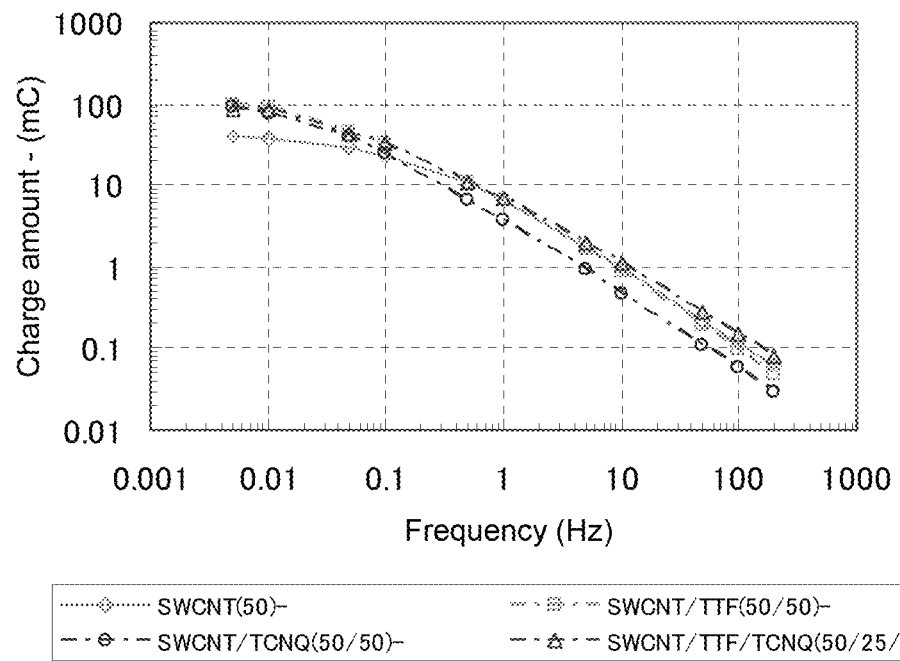
Figure 4:
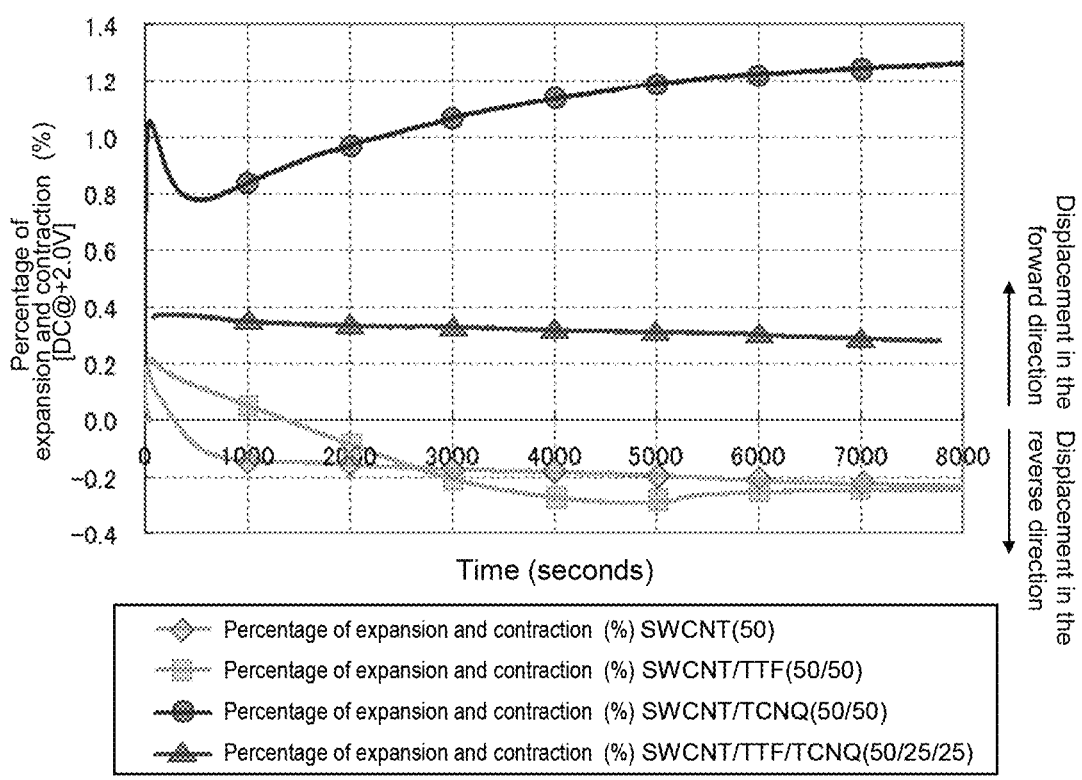
FIG. 4 shows the evaluation results of the durability of each of the actuators obtained in Examples 1 to 3 and Comparative Example 1 upon application of a direct-current voltage (DC2V). The vertical axis indicates the percentage of expansion and contraction (%), and the horizontal axis indicates time (seconds).
Figure 5A:
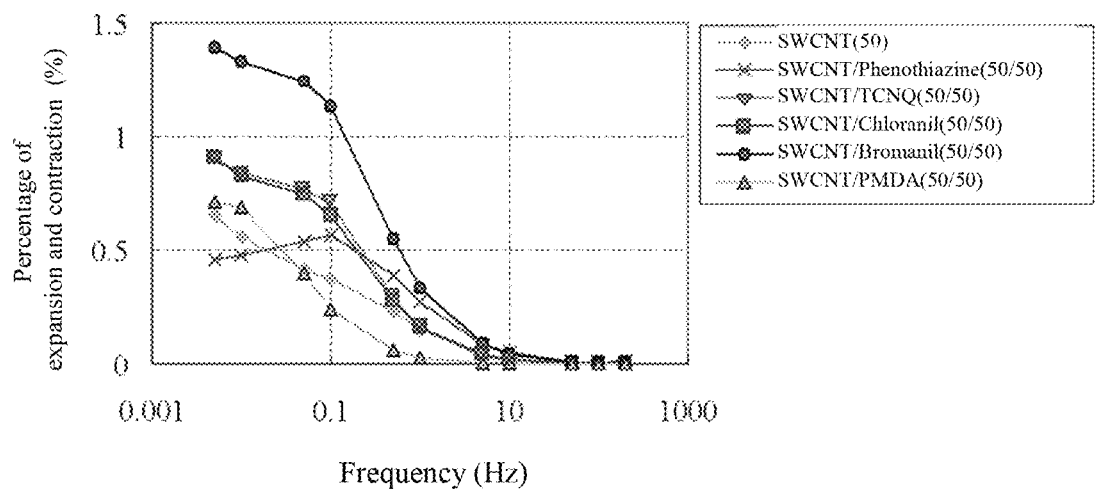
FIGS. 5(A) and 5(B) show frequency dependence of the displacement (percentage of expansion and contraction) of each of the actuators obtained in Examples 4 to 8 and Comparative Example 1. The horizontal axis indicates frequency (Hz), and the vertical axis indicates the percentage of expansion and contraction (%).
Figure 5B:
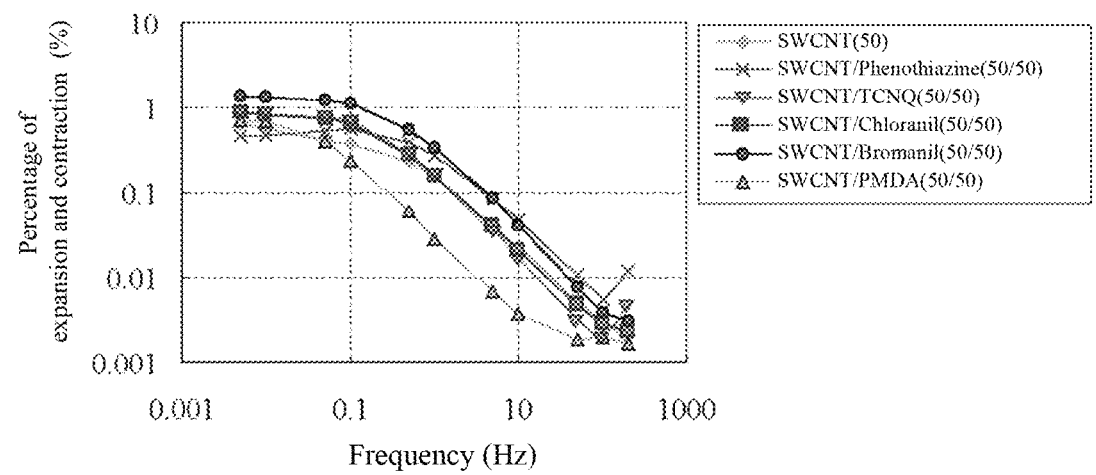
Figure 5C:
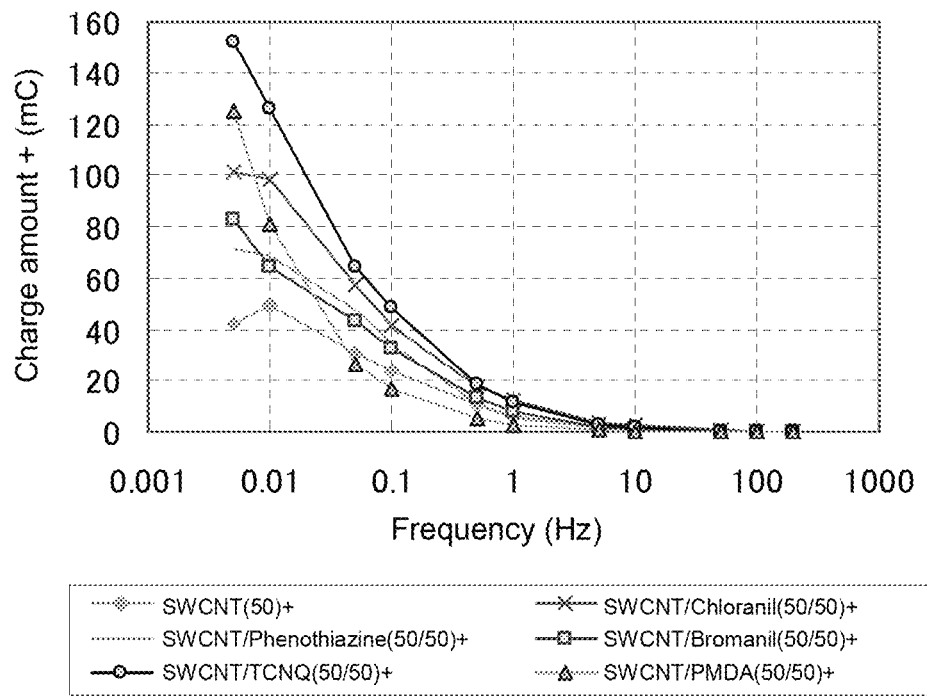
FIGS. 5(C) and 5(D) show frequency dependence of the charge (charge amount (positive)) of each of the actuators obtained in Examples 4 to 8 and Comparative Example 1. The horizontal axis indicates frequency (Hz), and the vertical axis indicates the charge amount (positive).
Figure 5D:
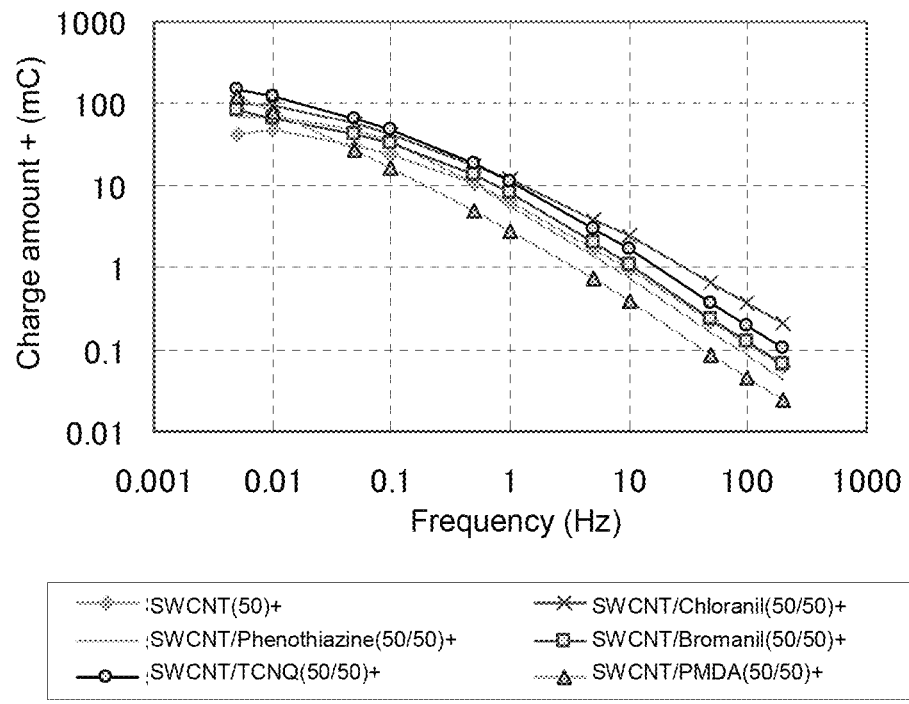
Figure 5E:
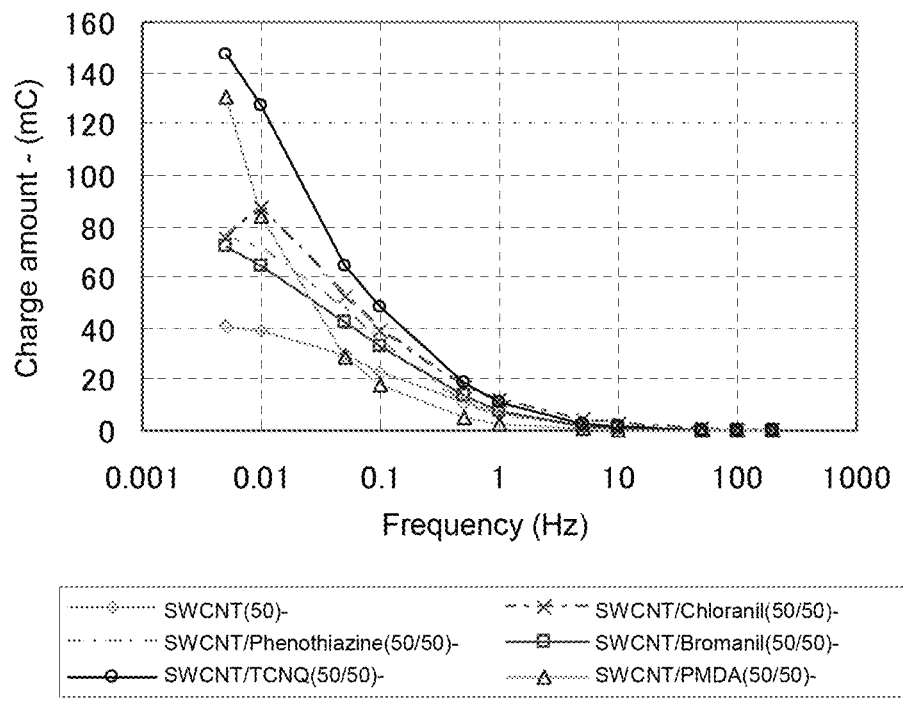
FIGS. 5(E) and 5(F) show frequency dependence of the charge (charge amount (negative)) of each of the actuators obtained in Examples 4 to 8 and Comparative Example 1. The horizontal axis indicates frequency (Hz), and the vertical axis indicates the charge amount (negative).
Figure 5F:
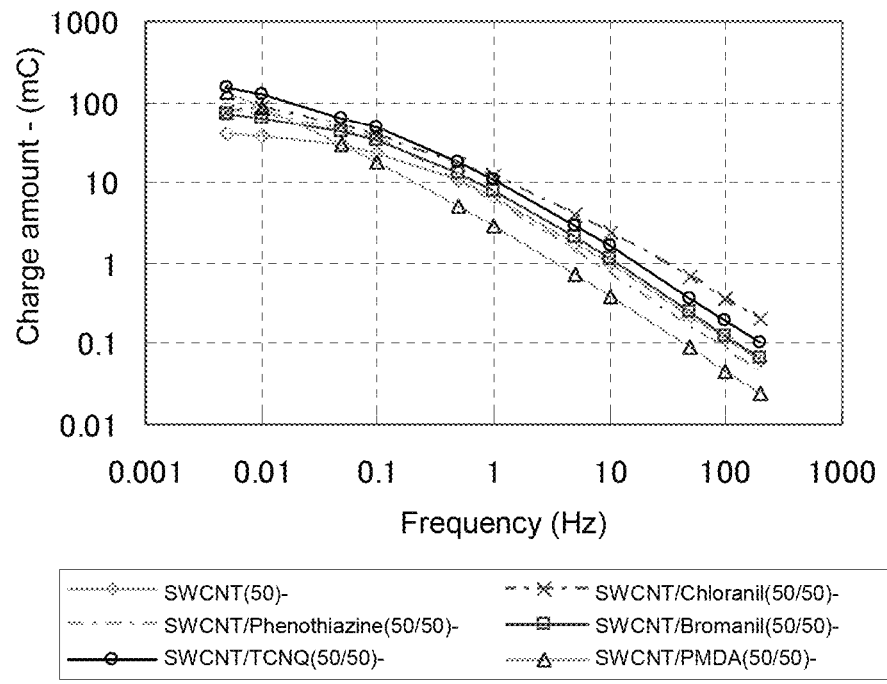
Figure 6:
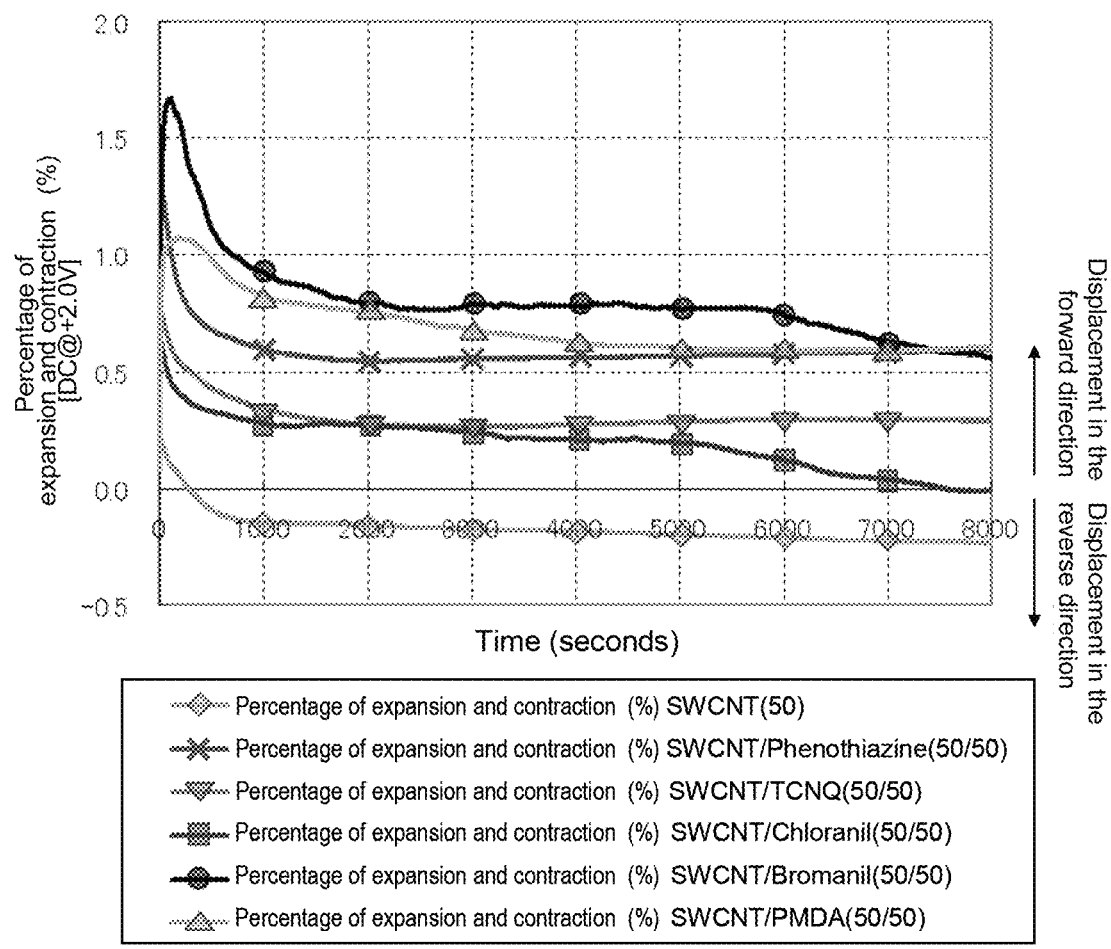
FIG. 6 shows the evaluation results of the durability of each of the actuators obtained in Examples 4 to 8 and Comparative Example 1 upon application of a direct-current voltage (DC2V). The vertical axis indicates the percentage of expansion and contraction (%), and the horizontal axis indicates time (seconds).

The elements were cut into 1 mm×10 mm rectangles to obtain samples, and the displacement of each sample at a position 5 mm upon application of a voltage was measured with a laser displacement meter, as shown in FIG. 2. The percentage of expansion and contraction was determined from the measured displacement according to formula (1) to compare the amounts of deformation of the actuator elements. In the system shown in FIG. 2, the charge amount and the frequency can be measured using a potentiostat and an oscilloscope at the same time as the amount of deformation is measured.

$$\varepsilon = 100 \times 2WD/(L^2 + D^2) \quad \text{(Formula 1)}$$

Here, ε indicates the percentage of expansion and contraction (%), W indicates the thickness of an actuator (mm), L indicates free length (5 mm), and D indicates the amount of displacement (mm).

The ionic liquid (IL) used in the Examples and the Comparative Example is ethylmethylimidazolium tetrafluoroborate ($EMIBF_4$).

The carbon nanotubes used in the Examples and the Comparative Example are high-purity single-walled carbon nanotubes (HiPco produced by Unidym) (hereafter, may be referred to as SWCNTs).

The polymer used in the Examples and the Comparative Example is polyvinylidene fluoride-hexafluoropropylene copolymer (PVDF(HFP); trade name: kynar2801) (V).

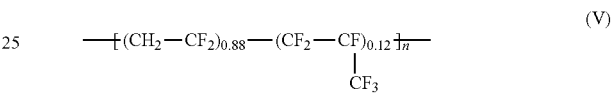

(V)

The solvent used in the Examples and the Comparative Example is N,N-dimethylacetamide (DMAC).

The TCNQ used in the Examples is available from Aldrich.

The TTF used in the Examples is available from Aldrich.

Preparation Example 1

Preparation of Dispersion Liquid for Forming Conductive Thin Film Layers

A dispersion liquid for forming conductive thin film layers is prepared by dispersing carbon nanotubes (SWCNTs), an ionic liquid (IL), a polymer (powdered PVDF(HFP)), and an organic molecule in a DMAC solvent and stirring the mixture with a magnetic stirrer, followed by ultrasonic dispersion.

Preparation of Solution for Forming Electrolyte Membranes

A solution for forming electrolyte membranes is prepared by dissolving an ionic liquid (IL) and a polymer (powdered PVDF(HFP)) in a solvent in a manner similar to that of the preparation of the dispersion liquid for forming conductive thin film layers.

Production of Actuator Element

A conductive thin film and an electrolyte membrane are obtained by separately casting the dispersion liquid and solution, respectively, prepared as described above and drying the respective solvents at room temperature for one day and night, followed by vacuum drying.

One electrolyte membrane thus obtained is sandwiched between two conductive thin films thus obtained. Thermocompression bonding is then performed, thereby obtaining an actuator element with a three-layer structure.

Method for Evaluating Actuator Element

The displacement responsiveness of each of the produced actuator elements was evaluated using the device shown in FIG. 2. The actuator elements were cut into 1-mm-wide× 10-mm-long rectangles to obtain samples. A portion 3 mm from one end of each sample was gripped with a holder having electrodes. The displacement at a position 5 mm from the gripped end upon application of a voltage in air was measured with a laser displacement meter.

Evaluation of Conductivity and Young's Modulus of Conductive Thin Film

The conductivity of each of the produced conductive thin films was measured by using the four probe DC current method. The Young's modulus of each conductive thin film was determined by using a stress-strain measurement.

Example 1

A film-like actuator element having a three-layer structure of a conductive thin film layer (electrode), an electrolyte membrane, and a conductive thin film layer (electrode) was produced using carbon nanotubes (CNTs), an ionic liquid ($EMIBF_4$), a polymer (kynar2801), and an electron-donating organic molecule (TTF) at the ratios shown below.
Electrode: CNT/kynar2801/$EMIBF_4$/TTF=50.7 mg/80.1 mg/120.8 mg/50.7 mg
Electrolyte: kynar2801/$EMIBF_4$=101.8 mg/114.3 mg Example 2

A film-like actuator element having a three-layer structure of a conductive thin film layer (electrode), an electrolyte membrane, and a conductive thin film layer (electrode) was produced using carbon nanotubes (CNTs), an ionic liquid ($EMIBF_4$), a polymer (kynar2801), and an electron-withdrawing organic molecule (TCNQ) at the ratios shown below.
Electrode: CNT/kynar2801/$EMIBF_4$/TCNQ=50.2 mg/80.2 mg/120.8 mg/50.6 mg
Electrolyte: kynar2801/$EMIBF_4$=101.8 mg/114.3 mg Example 3

A film-like actuator element having a three-layer structure of a conductive thin film layer (electrode), an electrolyte membrane, and a conductive thin film layer (electrode) was produced using carbon nanotubes (CNTs), an ionic liquid ($EMIBF_4$), a polymer (kynar2801), and organic molecules (TTF, TCNQ) at the ratios shown below.
Electrode: CNT/kynar2801/$EMIBF_4$/TTF/TCNQ=50.7 mg/80.1 mg/120.1 mg/25.1 mg/25.0 mg
Electrolyte: kynar2801/$EMIBF_4$=101.8 mg/114.3 mg Example 4

A film-like actuator element having a three-layer structure of a conductive thin film layer (electrode), an electrolyte membrane, and a conductive thin film layer (electrode) was produced using carbon nanotubes (CNTs), an ionic liquid ($EMIBF_4$), a polymer (kynar2801), and an electron-donating organic molecule (phenothiazine) at the ratios shown below.
Electrode: CNT/kynar2801/$EMIBF_4$/phenothiazine=50.4 mg/80.2 mg/120.1 mg/50.1 mg
Electrolyte: kynar2801/$EMIBF_4$=101.8 mg/114.3 mg Example 5

A film-like actuator element having a three-layer structure of a conductive thin film layer (electrode), an electrolyte membrane, and a conductive thin film layer (electrode) was produced using carbon nanotubes (CNTs), an ionic liquid ($EMIBF_4$), a polymer (kynar2801), and an electron-withdrawing organic molecule (TCNQ) at the ratios shown below.
Electrode: CNT/kynar2801/$EMIBF_4$/TCNQ=50.2 mg/80.2 mg/120.8 mg/25.0 mg
Electrolyte: kynar2801/$EMIBF_4$=101.8 mg/114.3 mg Example 6

A film-like actuator element having a three-layer structure of a conductive thin film layer (electrode), an electrolyte membrane, and a conductive thin film layer (electrode) was produced using carbon nanotubes (CNTs), an ionic liquid ($EMIBF_4$), a polymer (kynar2801), and an electron-withdrawing organic molecule (chloranil) at the ratios shown below.
Electrode: CNT/kynar2801/$EMIBF_4$/chloranil=50.2 mg/80.2 mg/120.8 mg/50.0 mg
Electrolyte: kynar2801/$EMIBF_4$=101.8 mg/114.3 mg Example 7

A film-like actuator element having a three-layer structure of a conductive thin film layer (electrode), an electrolyte membrane, and a conductive thin film layer (electrode) was produced using carbon nanotubes (CNTs), an ionic liquid ($EMIBF_4$), a polymer (kynar2801), and an electron-withdrawing organic molecule (bromanil) at the ratios shown below.
Electrode: CNT/kynar2801/$EMIBF_4$/bromanil=50.2 mg/80.2 mg/120.8 mg/50.1 mg
Electrolyte: kynar2801/$EMIBF_4$=101.8 mg/114.3 mg Example 8

A film-like actuator element having a three-layer structure of a conductive thin film layer (electrode), an electrolyte membrane, and a conductive thin film layer (electrode) was produced using carbon nanotubes (CNTs), an ionic liquid ($EMIBF_4$), a polymer (kynar2801), and an electron-withdrawing organic molecule (PMDA) at the ratios shown below.
Electrode: CNT/kynar2801/$EMIBF_4$/PMDA=50.2 mg/80.2 mg/120.8 mg/50.3 mg
Electrolyte: kynar2801/$EMIBF_4$=101.8 mg/114.3 mg The structures of the organic molecules used are shown below.

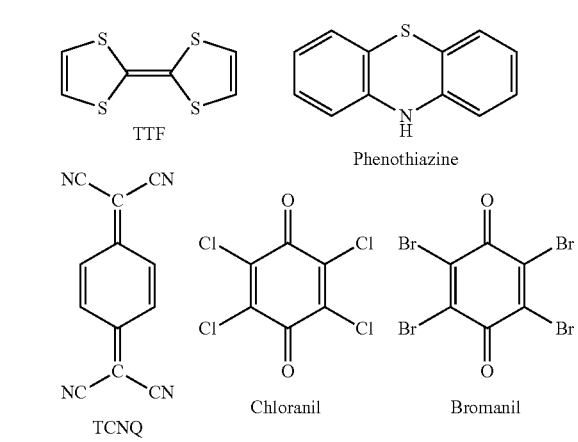

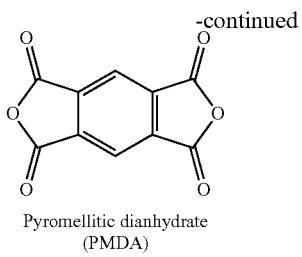

Pyromellitic dianhydrate
(PMDA)

Comparative Example 1

A film-like actuator element having a three-layer structure of a conductive thin film layer (electrode), an electrolyte membrane, and a conductive thin film layer (electrode) was produced using carbon nanotubes (CNTs), an ionic liquid ($EMIBF_4$), and a polymer (kynar2801) at the ratios shown below.
Electrode: CNT/kynar2801/$EMIBF_4$=50.2 mg/80.0 mg/125.6 mg
Electrolyte: kynar2801/$EMIBF_4$=206.2 mg/208.3 mg Test Example 1

The responsiveness and durability of each of the actuator elements obtained in Examples 1 to 8 and Comparative Example 1 to a voltage and the properties of the electrode films of the actuator elements were evaluated. FIGS. 3(A)-(F), 4, 5(A)-(F), and 6, and Tables 1 to 3 show the results.

The results shown in FIGS. 3(A)-(F), 4, 5(A)-(F), and 6 reveal that when a conductive thin film layer comprises an electron-donating organic molecule (TTF), high-speed responsiveness can be further improved, and, on the other hand, that when a conductive thin film layer comprises an electron-withdrawing organic molecule (TCNQ), responsiveness in the low-frequency region is further improved.

The results also reveal that the return phenomenon of displacement (reverse displacement) when a constant voltage is continuously applied can be suppressed by adding an electron-withdrawing organic molecule such as TCNQ. The results further reveal that the return phenomenon (reverse displacement) can be reduced by using an electron-donating organic molecule such as TTF.

The results show that, in particular, when a conductive thin film layer comprises TCNQ as an electron-withdrawing organic molecule, the amount of deformation is maintained, the effect of inhibiting displacement in the reverse direction is high, and the amount of displacement is notably high even if a constant voltage is continuously applied for a long period of time. The results also show that when an electron-donating organic molecule and an electron-withdrawing organic molecule (TCNQ and TTF) are used in combination, the amount of deformation is maintained and the effect of inhibiting displacement in the reverse direction is notably high even if a constant voltage is continuously applied for a long period of time.

TABLE 1

| Electrode film | Conductivity (S/cm) |
| --- | --- |
| SWCNT/TTF (50/50) | 1.6 |
| SWCNT/TCNQ (50/50) | 3.1 |

TABLE 1-continued

| Electrode film | Conductivity (S/cm) |
| --- | --- |
| SWCNT/TTF/TCNQ (50/25/25) | 1.4 |
| SWCNT (50) | 4.1 |

Conductivity of Each of the Conductive Thin Films Obtained in Examples 1 to 3 and Comparative Example 1

TABLE 2

| Electrode film | Young's modulus (MPa) |
| --- | --- |
| SWCNT/TTF (50/50) | 379 |
| SWCNT/TCNQ (50/50) | 379 |
| SWCNT/TTF/TCNQ (50/25/25) | 755 |
| SWCNT (50) | 280 |

Young's Modulus of Each of the Conductive Thin Films Obtained in Examples 1 to 3 and Comparative Example 1

TABLE 3

| | Organic molecule added | Percentage of expansion and contraction after 2 hours/Maximum percentage of expansion and contraction | Improvement effect |
| --- | --- | --- | --- |
| Comparative Example 1 | Not added | −0.780 | Control |
| Example 1 | TTF | −1.12 | ± |
| Example 2 | TCNQ | 1.18 | ++++++ |
| Example 3 | TTF/TCNQ | 0.740 | ++++ |
| Example 4 | Phenothiazine | 0.472 | +++ |
| Example 5 | TCNQ (half the amount) | 0.391 | ++ |
| Example 6 | Chloranil | 0.0426 | + |
| Example 7 | Bromanil | 0.368 | ++ |
| Example 8 | PMDA | 0.548 | +++ |

Improvement in Durability upon Application of Direct-current Voltage by Adding Organic Molecule

EXPLANATION OF REFERENCE NUMERALS

1 Electrolyte membrane
2 Conductive thin film layer
3 Conductive layer

The invention claimed is:
1. A laminate comprising:
one or more conductive thin films and,
one or more electrolyte membranes including an ionic liquid and a polymer,
wherein each of the one or more conductive thin films comprises a homogeneous mixture comprising 5-90% by weight of a nano-carbon material, 5-80% by weight of an ionic liquid, 4-70% by weight of a polymer, and an organic molecule component comprising at least one electron-withdrawing organic molecule selected from the group consisting of chloranil, bromanil, and pyromellitic dianhydride (PMDA),
wherein the organic molecule component is present in an amount of 20 to 100 parts by weight per 50 parts by weight of the nano-carbon material, and
wherein the homogeneous mixture forms a gel.

2. The laminate according to claim 1, wherein the organic molecule component further comprises at least one electron-donating organic molecule.

3. The laminate according to claim 1, wherein the polymer in the conductive thin film is the same as the polymer in the electrolyte membranes.

4. The laminate according to claim 1, wherein the nano-carbon material includes at least one of carbon nanotubes, carbon nanohorns, and carbon nanofibers.

5. The laminate according to claim 1, wherein the nano-carbon material further includes a conductive additive.

6. An actuator element comprising the laminate according to claim 1.

7. An actuator element comprising the laminate according to claim 2.

8. An actuator element comprising the laminate according to claim 3.

9. An actuator element comprising the laminate according to claim 4.

10. An actuator element comprising the laminate according to claim 5.

11. The actuator element according to claim 6, comprising at least two conductive thin film layers each comprising the conductive thin film as an electrode and provided on a surface or surfaces of an electrolyte membrane in such a manner that the conductive thin film layers are insulated from one another, the electrolyte membrane comprising an ionic liquid and a polymer, and the actuator element being deformable by applying a potential difference between the conductive thin film layers.

12. The actuator element according to claim 7, comprising at least two conductive thin film layers each comprising the conductive thin film as an electrode and provided on a surface or surfaces of an electrolyte membrane in such a manner that the conductive thin film layers are insulated from one another, the electrolyte membrane comprising an ionic liquid and a polymer, and the actuator element being deformable by applying a potential difference between the conductive thin film layers.

13. The actuator element according to claim 8, comprising at least two conductive thin film layers each comprising the conductive thin film as an electrode and provided on a surface or surfaces of an electrolyte membrane in such a manner that the conductive thin film layers are insulated from one another, the electrolyte membrane comprising an ionic liquid and a polymer, and the actuator element being deformable by applying a potential difference between the conductive thin film layers.

14. The actuator element according to claim 9, comprising at least two conductive thin film layers each comprising the conductive thin film as an electrode and provided on a surface or surfaces of an electrolyte membrane in such a manner that the conductive thin film layers are insulated from one another, the electrolyte membrane comprising an ionic liquid and a polymer, and the actuator element being deformable by applying a potential difference between the conductive thin film layers.

15. The actuator element according to claim 10, comprising at least two conductive thin film layers each comprising the conductive thin film as an electrode and provided on a surface or surfaces of an electrolyte membrane in such a manner that the conductive thin film layers are insulated from one another, the electrolyte membrane comprising an ionic liquid and a polymer, and the actuator element being deformable by applying a potential difference between the conductive thin film layers.

\* \* \* \* \*